(12) United States Patent
Raj et al.

(10) Patent No.: US 9,059,557 B2
(45) Date of Patent: Jun. 16, 2015

(54) NON-LINEAR VERTICAL-CAVITY SURFACE-EMITTING LASER EQUALIZATION

(71) Applicant: California Institute of Technology, Pasadena, CA (US)

(72) Inventors: Mayank Raj, Pasadena, CA (US); Azita Emami, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 14/502,864

(22) Filed: Sep. 30, 2014

(65) Prior Publication Data

US 2015/0139257 A1    May 21, 2015

Related U.S. Application Data

(60) Provisional application No. 61/905,637, filed on Nov. 18, 2013.

(51) Int. Cl.
| H01S 3/13 | (2006.01) |
| H01S 5/06 | (2006.01) |
| H01S 5/183 | (2006.01) |
| H01S 5/068 | (2006.01) |

(52) U.S. Cl.
CPC ............... *H01S 5/0604* (2013.01); *H01S 5/183* (2013.01); *H01S 5/06808* (2013.01); *H01S 5/068* (2013.01); *H01S 3/1306* (2013.01); *H01S 3/1305* (2013.01); *H01S 3/13* (2013.01)

(58) Field of Classification Search
CPC ..... H01S 5/06808; H01S 5/068; H01S 5/183; H01S 3/1306; H01S 3/1305; H01S 3/13
USPC .................. 372/29.31, 29.02, 29.011, 29.015, 372/38.07, 50.124
See application file for complete search history.

(56) References Cited

U.S. PATENT DOCUMENTS

| 2004/0184492 A1* | 9/2004 | Windover ........................ 372/31 |
| 2011/0122912 A1* | 5/2011 | Benjamin et al. ........ 372/50.124 |
| 2014/0126595 A1* | 5/2014 | Nedovic et al. ............ 372/38.02 |

OTHER PUBLICATIONS

Liu, Y. et al., "Simulating the modulation response of VCSELs: the effects of diffusion capacitance and spatial hole-burning," IEE Proc.-Optoelectron., vol. 149, No. 4, (2002).

(Continued)

*Primary Examiner* — Kinam Park
(74) *Attorney, Agent, or Firm* — Turk IP Law, LLC (57) ABSTRACT

Technologies are generally described for implementing non-linear VCSEL equalization. In some examples, a rising edge tap parameter, a falling edge tap parameter, an equalization delay and a bias current may be used to equalize a data signal to be output from a VCSEL. A VCSEL model may be used to derive a VCSEL response to one or more isolated data pulses. The derived response may then be used to determine the rising and falling edge tap parameters and an equalization delay, based on a bias current value for the VCSEL and a data rate associated with the data signal. The data signal may then be adjusted based on the equalization delay and the rising and falling edge tap parameter and sent to the VCSEL for output. At the same time, the VCSEL may be biased with a bias current having the bias current value.

23 Claims, 9 Drawing Sheets

(56) References Cited

OTHER PUBLICATIONS

Ly, K.S. et al., "Optimization of an avionic VCSEL-based optical Link through large signal characterization," Proc. SPIE, vol. 6997 (2008).

Minoglou, K. et al., "A Compact Nonlinear Equivalent Circuit Model and Parameter Extraction Method for Packaged High-Speed VCSELs," Journal of Lightwave Technology, vol. 22, No. 12, (2004).

Ohhata, K. et al., "Design of a 4×10 Gb/s VCSEL Driver Using Asymmetric Emphasis Technique in 90-nm CMOS for Optical Interconnection," IEEE Transactions on Microwave Theory and Techniques, vol. 58, No. 5, pp. 1107-1115 (2010).

Westbergh, P. et al., "High speed, low current density 850 nm VCSELs," IEEE J.Sel. Top. Quantum Electron., vol. 15, No. 3, pp. 694-703 (2009).

* cited by examiner

COMPUTER PROGRAM PRODUCT 900

SIGNAL-BEARING MEDIUM 902

904 AT LEAST ONE OF

ONE OR MORE INSTRUCTIONS TO DETERMINE A RISING EDGE TAP PARAMETER AND A FALLING EDGE TAP PARAMETER BASED ON A VCSEL RESPONSE AND A DATA RATE;

ONE OR MORE INSTRUCTIONS TO DETERMINE AN EQUALIZATION DELAY BASED ON THE VCSEL RESPONSE AND A BIAS CURRENT VALUE;

ONE OR MORE INSTRUCTIONS TO ADJUST A DATA SIGNAL BASED ON THE RISING EDGE TAP PARAMETER, THE FALLING EDGE TAP PARAMETER, AND THE EQUALIZATION DELAY;

ONE OR MORE INSTRUCTIONS TO PROVIDE A BIAS CURRENT WITH THE BIAS CURRENT VALUE TO THE VCSEL; AND

ONE OR MORE INSTRUCTIONS TO SEND THE ADJUSTED DATA SIGNAL TO THE VCSEL FOR OUTPUT.

| COMPUTER-READABLE MEDIUM 906 | RECORDABLE MEDIUM 908 | COMMUNICATIONS MEDIUM 910 |

FIG. 9

NON-LINEAR VERTICAL-CAVITY SURFACE-EMITTING LASER EQUALIZATION

CROSS-REFERENCE TO RELATED APPLICATION

This application claims the benefit under 35 U.S.C. §119 (e) of U.S. Provisional Patent Application Ser. No. 61/905,637 filed on Nov. 18, 2013, entitled "Novel VCSEL Equalization Technique". The disclosure of the U.S. Provisional Patent Application is hereby incorporated by reference in its entirety.

BACKGROUND

Unless otherwise indicated herein, the materials described in this section are not prior art to the claims in this application and are not admitted to be prior art by inclusion in this section.

A vertical-cavity surface-emitting laser (VCSEL) is a laser fabricated in a vertical orientation such that light emission is perpendicular to a top (or bottom) surface of the VCSEL. VCSELs may be commonly used because they may be fabricated on semiconductor wafers using standard semiconductor processes, may be easily tested during fabrication, and may be a simple way to provide optical capabilities to semiconductor-based integrated circuits. Because VCSELs emit light perpendicular to the surface of the laser, tens of thousands of VCSELs can be processed on a single wafer.

SUMMARY

The present disclosure generally describes techniques for performing non-linear vertical-cavity surface-emitting laser (VCSEL) equalization.

According to some examples, a method is provided to perform a non-linear equalization of a data signal to be output from a vertical-cavity surface-emitting laser (VCSEL). The method may include determining, based on an isolated-pulse-VCSEL-response and a data rate associated with the data signal, a rising edge tap parameter and a falling edge tap parameter and determining an equalization delay based on the isolated-pulse-VCSEL-response and a bias current value. The method may further include adjusting the data signal based on the rising edge tap parameter, the falling edge tap parameter, and the equalization delay, providing a bias current having the bias current value to the VCSEL, and sending the adjusted data signal to the VCSEL for output.

According to other examples, a vertical-cavity surface-emitting laser (VCSEL) module configured to perform non-linear equalization is provided. The VCSEL module may include a VCSEL, a processor block, and an equalization module. The processor block may be configured to receive a data signal to be output from the VCSEL and determine a rising edge tap parameter and a falling edge tap parameter based on an isolated-pulse-VCSEL-response and a data rate associated with the data signal. The processor block may be further configured to determine an equalization delay based on the isolated-pulse-VCSEL-response and a bias current value and provide a bias current having the bias current value to the VCSEL. The equalization module may be configured to adjust the data signal based on the rising edge tap parameter, the falling edge tap parameter, and the equalization delay, and send the adjusted data signal to the VCSEL for output.

According to further examples, a vertical-cavity surface-emitting laser (VCSEL) circuit configured to perform non-linear equalization is provided. The VCSEL circuit may include an equalization delay module configured to determine an equalization delay based on an isolated-pulse-VCSEL-response and a bias current value. The VCSEL circuit may further include a rising edge detection module configured to output a first adjusted data signal based on an input data signal, the equalization delay, and a rising edge tap parameter, where the rising edge parameter may be based on the isolated-pulse-VCSEL response and a data rate associated with the input data signal. The VCSEL circuit may further include a falling edge detection module configured to output a second adjusted data signal based on the input data signal, the equalization delay, and a falling edge tap parameter, where the falling edge tap parameter may be based on the isolated-pulse-VCSEL-response and the data rate. The VCSEL circuit may further include a VCSEL configured to output a combination of the input data signal, the first adjusted data signal, and the second adjusted data signal.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices, and/or computer program products related to performing non-linear vertical-cavity surface-emitting laser (VCSEL) equalization.

Briefly stated, technologies are generally described for implementing non-linear VCSEL equalization. In some examples, a rising edge tap parameter, a falling edge tap parameter, an equalization delay and a bias current may be used to equalize a data signal to be output from a VCSEL. A VCSEL model may be used to derive a VCSEL response to one or more isolated data pulses. The derived response may then be used to determine the rising and falling edge tap parameters and an equalization delay, based on a bias current value for the VCSEL and a data rate associated with the data signal. The data signal may then be adjusted based on the equalization delay and the rising and falling edge tap parameter and sent to the VCSEL for output. At the same time, the VCSEL may be biased with a bias current having the bias current value.

Figure 1:
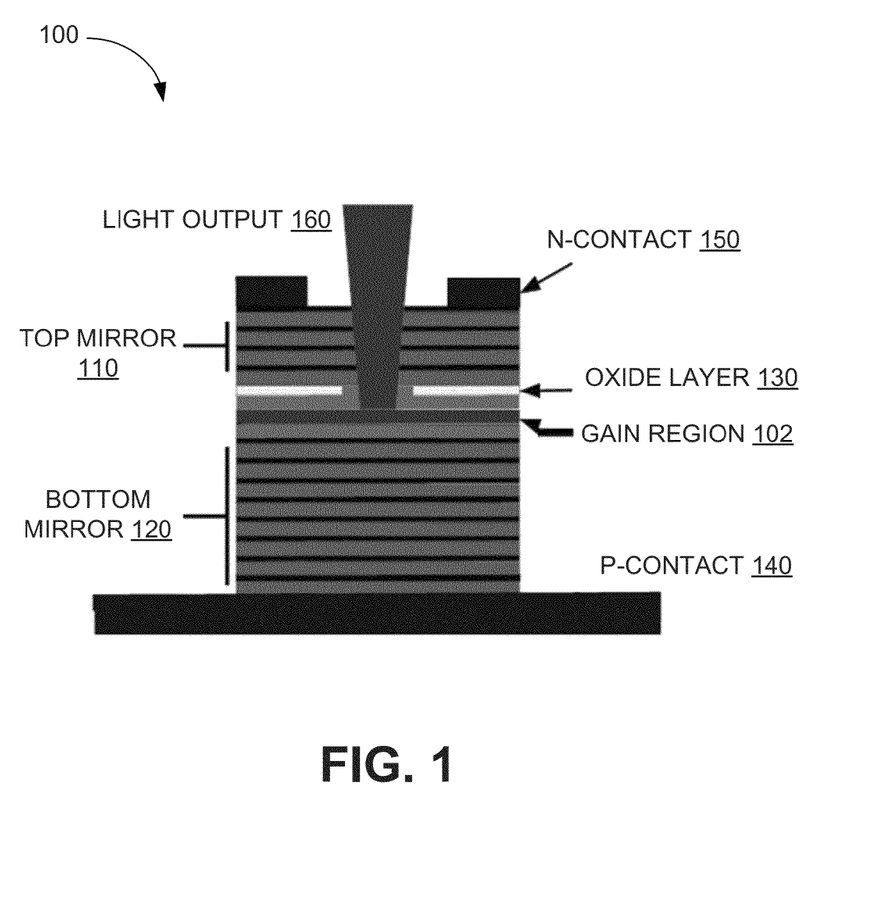
FIG. 1 illustrates an example vertical-cavity surface-emitting laser (VCSEL)

FIG. 1 illustrates an example vertical-cavity surface-emitting laser (VCSEL) 100, arranged in accordance with at least some embodiments described herein.

The VCSEL 100 may include a top mirror 110, a bottom mirror 120, and a gain region 102 and an oxide layer 130 disposed between the top mirror 110 and the bottom mirror 120. The top mirror 110, the bottom mirror 120, and the gain region 102/oxide layer 130 may form a vertically-oriented optical cavity that traps photons for amplification and subsequent coherent emission as an optical output 160. The VCSEL 100 may also include a p-contact 140 formed of p-type semiconductor material and an n-contact 150 formed of n-type semiconductor material for providing energy (for example, in the form of electrical current) to the optical cavity for photon generation and amplification.

In some embodiments, the VCSEL 100 may be used to convert an electrical data input signal into an optical data output signal. For example, an electrical input signal may be used to modulate a bias current flowing between the p-contact 140 and the n-contact 150. The VCSEL 100 may then convert the modulated bias current into the optical output 160.

However, in many circumstances the optical output 160 may not exactly correspond to the electrical input signal. This may be due to how the VCSEL 100 converts an electrical input signal to an optical output signal, which may be described by a VCSEL modulation transfer characteristic or function. In some embodiments, the VCSEL 100 may have a non-linear modulation transfer function of the form:

$$H_i(f) = \frac{f_r^2}{f_r^2 - f^2 + j\left(\frac{f}{2\pi}\right)\gamma},$$

where $f_r = D\sqrt{I_D - I_{th}}$ is a resonance frequency of the VCSEL and D is known as the D-factor 100, $\gamma$ (the damping coefficient) is $Kf_r^2 + \gamma_o$, and K is known as a K-factor.

In some embodiments, the electrical input signal may be equalized before it is used to modulate the bias current of the VCSEL 100 in order to shape the optical output signal. The equalization process may be selected or designed based on the non-linear nature of the VCSEL modulation transfer function.

Figure 2:
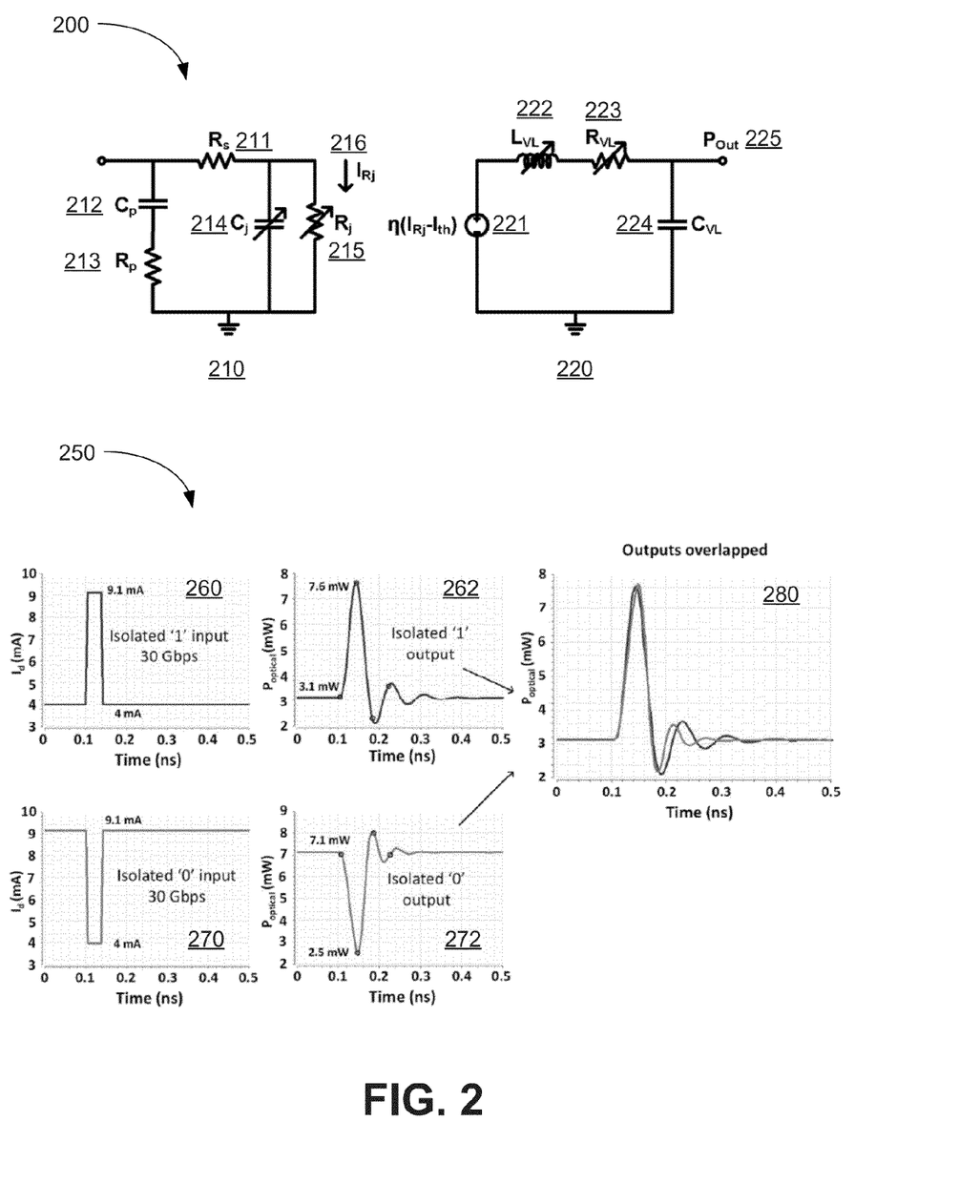
FIG. 2 is an example diagram of the derivation of VCSEL responses to data pulses that may be used in non-linear VCSEL equalization.

FIG. 2 is an example diagram of the derivation of VCSEL responses to data pulses that may be used in non-linear VCSEL equalization, arranged in accordance with at least some embodiments described herein.

In some embodiments, VCSEL electrical input data signals may take the form of discrete electrical pulses with relatively well-defined rising and falling edges at the beginnings and ends of the pulses, respectively. When an electrical pulse with rising and falling edges is provided as an input into a VCSEL without equalization, the optical output from the VCSEL may include distortions at those edges. Such distortions may result from the VCSEL electrical-optical signal conversion, which may be represented as a VCSEL modulation transfer function as described above.

In some embodiments, a VCSEL model 200 may be used to represent the VCSEL electrical-optical signal conversion process. The VCSEL model 200 may include an electrical portion 210 that may model the electrical behavior of the VCSEL and an optical portion 220 that may model the optical behavior of the VCSEL. The electrical portion 210 may include a resistance $R_s$ 211 coupled to a capacitance $C_p$ 212, which in turn may be coupled in series with a resistance $R_p$ 213. A variable capacitance $C_j$ 214 may be coupled to the resistances $R_s$ 211 and $R_p$ 213, and may also be coupled in parallel to a variable resistance $R_j$ 215. A current $I_{Rj}$ 216 flowing through the variable resistance $R_j$ 215 may then be coupled into the optical portion 220 as a component of a voltage source 221. In the optical portion 220, the voltage source 221 may couple to a variable inductance $L_{VL}$ 222 and a capacitance $C_{VL}$ 224. The variable inductance $L_{VL}$ may in turn couple to a variable resistance $R_{VL}$ 223. The variable resistance $R_{VL}$ 223 may then couple to an output $P_{out}$ 225 and the capacitance $C_{VL}$ 224.

In some embodiments, the VCSEL model 200 may be used to model the response of a VCSEL to an input signal. According to a diagram 250, an isolated '1' input pulse 260 at a data rate of 30 gigabits per second (Gbps) with relatively well-defined rising and falling edges may result in a VCSEL model output pulse 262 with shape and edge distortions. Similarly, an isolated '0' input pulse 270 at a data rate of 30 Gbps may result in a VCSEL model output pulse 272 with shape and edge distortions. The VCSEL model output pulses 262 and 272 may then be used to derive amplification gains, which may be in the form of amplification weights or tap parameters, associated with rising and falling pulse edges. The amplification gains may then be used to adjust the magnitude of a 30 Gbps input data signal at its rising and falling edges in order to reduce shape and edge distortions in the final optical output. Since VCSEL model output pulse shapes may vary based on the data rate of the input signal, the amplification gains derived from the VCSEL model output pulses may also vary based on the data rate of the input signal, with different amplification gains associated with different data rates. In some embodiments, the VCSEL model output pulses 262 and 272 may be combined into a combination output 280, which may then be used to derive the gain parameters associated with rising and falling pulse edges of an input signal with a particular data rate.

Figure 3:
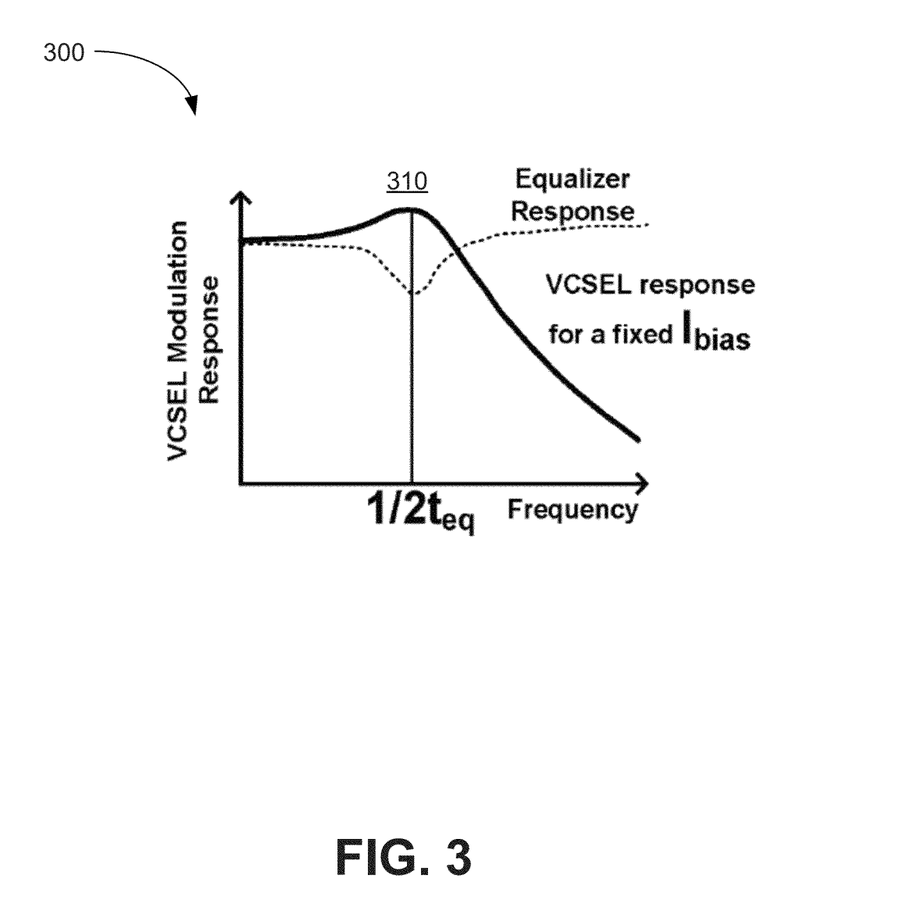
FIG. 3 is an example diagram of a VCSEL modulation response that may be used in non-linear VCSEL equalization.

FIG. 3 is an example diagram 300 of a VCSEL modulation response that may be used in non-linear VCSEL equalization, arranged in accordance with at least some embodiments described herein.

According to a diagram 300, a VCSEL modulation response for a particular value of bias current $I_{bias}$ may take the form of a second-order, low-pass transfer function. In some embodiments, this transfer function may be determined based on the electrical portion 210 of the VCSEL model 200, and may be described as a Laplace s-domain transfer function:

$$I_{Rj}(s)/I(s) = 1/1 + sC_j R_j,$$

where $C_j$ may be equivalent to the variable capacitance $C_j$ 214, $R_j$ may be equivalent to the variable resistance $R_j$ 215, $I_{Rj}$ may be equivalent to the current $I_{Rj}$ 216, and I may represent an input current into the electrical portion 210.

The VCSEL modulation response may be used to determine delay parameters for non-linear VCSEL equalization. In particular, a frequency of a pole 310 in the VCSEL modulation response (for example, the pole corresponding to $s=1/C_j R_j$) may be used to determine an equalization delay. In some embodiments, the equalization delay may be selected as inverse of twice the frequency of the pole 310 in order to cancel the peaking of the VCSEL response. Different values of bias current $I_{bias}$ may cause the VCSEL modulation response to differ, which in turn may mean that the frequency of the pole 310 in the VCSEL modulation response (and therefore the equalization delay) may vary depending on $I_{bias}$. In some embodiments, an equalization delay determination process may include the selection of an $I_{bias}$, the determination of the VCSEL modulation response corresponding to the selected $I_{bias}$, and the subsequent determination of the equalization delay based on the determined VCSEL modulation response.

Figure 4:
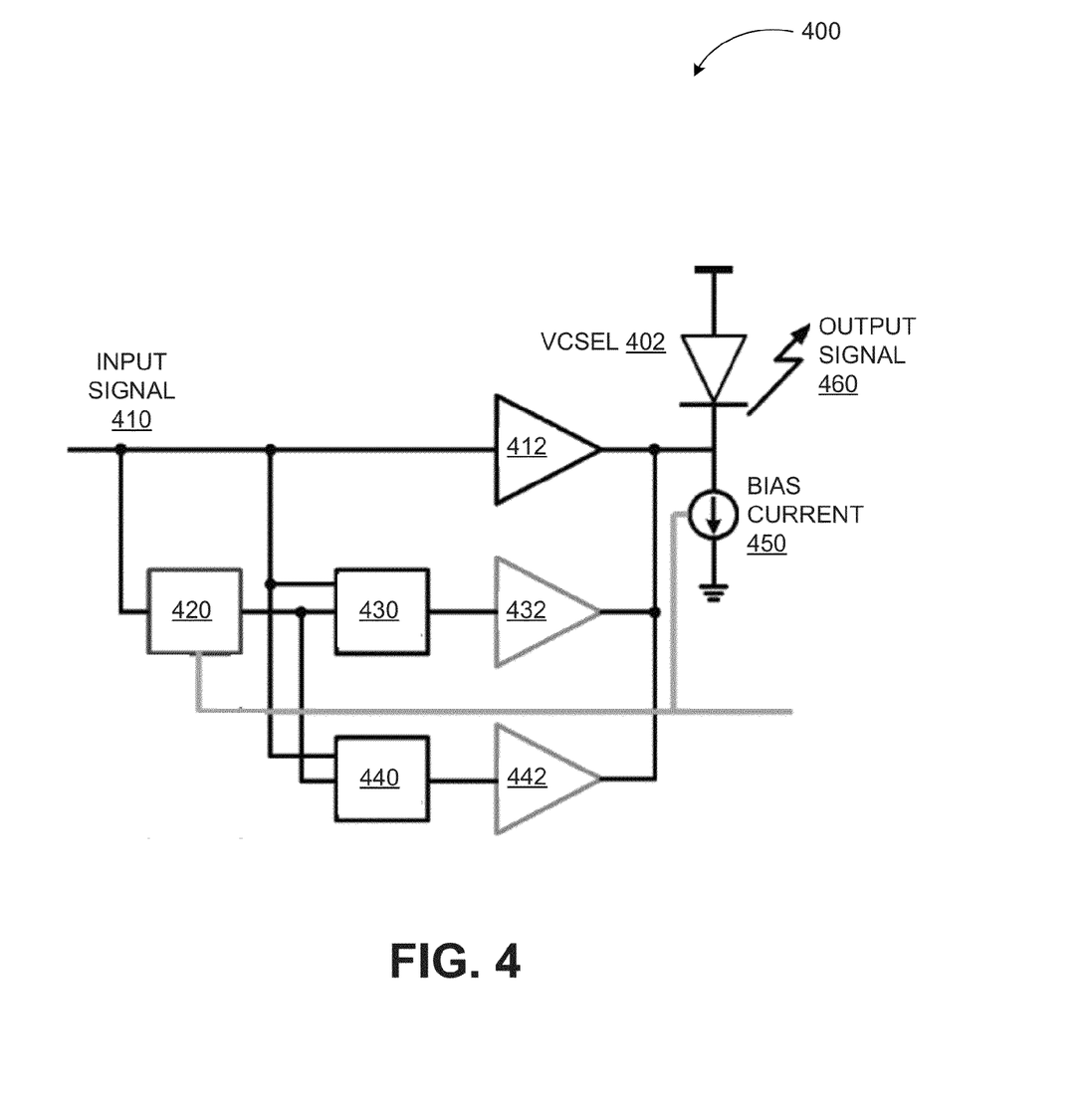
FIG. 4 is an example diagram of an input data signal after modulation with non-linear equalization.

FIG. 4 illustrates an example VCSEL system 400 configured to perform non-linear VCSEL equalization, arranged in accordance with at least some embodiments described herein.

The VCSEL system 400 may include a VCSEL 402, similar to the VCSEL 100, which may be configured to output an optical output signal 460, similar to the light output 160. An input signal 410, which may be an electrical data input signal, may be coupled to a terminal of an amplification stage 412, a terminal of an equalization delay module 420, a terminal of a rising edge detector 430, and to a terminal of a falling edge detector 440. The equalization delay module 420 in turn may be coupled to a bias current source 450, to the rising edge detector 430, and to the falling edge detector 440. The rising edge detector 430 may be coupled to the equalization delay module 420 and an amplification stage 432, and may have a terminal coupled to the input signal 410. Similarly, the falling edge detector 440 may be coupled to the equalization delay module 420 and an amplification stage 442, and may have a terminal coupled to the input signal 410. The amplification stages 412, 432, and 442 may in turn be coupled to the VCSEL 402 and the bias current source 450.

The VCSEL system 400 may be configured to perform equalization by adjustment of the input signal 410 to eliminate or reduce pulse distortions in the output signal 460, as shown above in FIG. 2. In some embodiments, the VCSEL system 400 may adjust rising and falling edges of pulses in the input signal 410 based on an equalization delay, a rising edge gain, and a falling edge gain, all described above. The equalization delay module 420 may determine and/or provide the equalization delay based on frequency peaks in a modeled VCSEL modulation response and the bias current 450 as described above. The rising edge detector 430, which may be implemented using complementary metal-oxide semiconductor (CMOS) technology, may be configured to detect rising pulse edges in the input signal 410. The amplification stage 432 may provide the rising edge gain at detected rising edges of the input signal 410 as, for example, a rising edge tap parameter determined based on the modeled VCSEL modulation response and a data rate of the input signal 410. The falling edge detector 440, which may be implemented using CMOS technology, may be configured to detect falling pulse edges in the input signal 410. Similar to the amplification stage 432, the amplification stage 442 may provide the falling edge gain as, for example, a falling edge tap parameter determined based on the modeled VCSEL modulation response and the data rate of the input signal 410. In some embodiments, a controller may also adjust the bias current 450 itself in order to match a selected modeled VCSEL modulation response.

Figure 5:
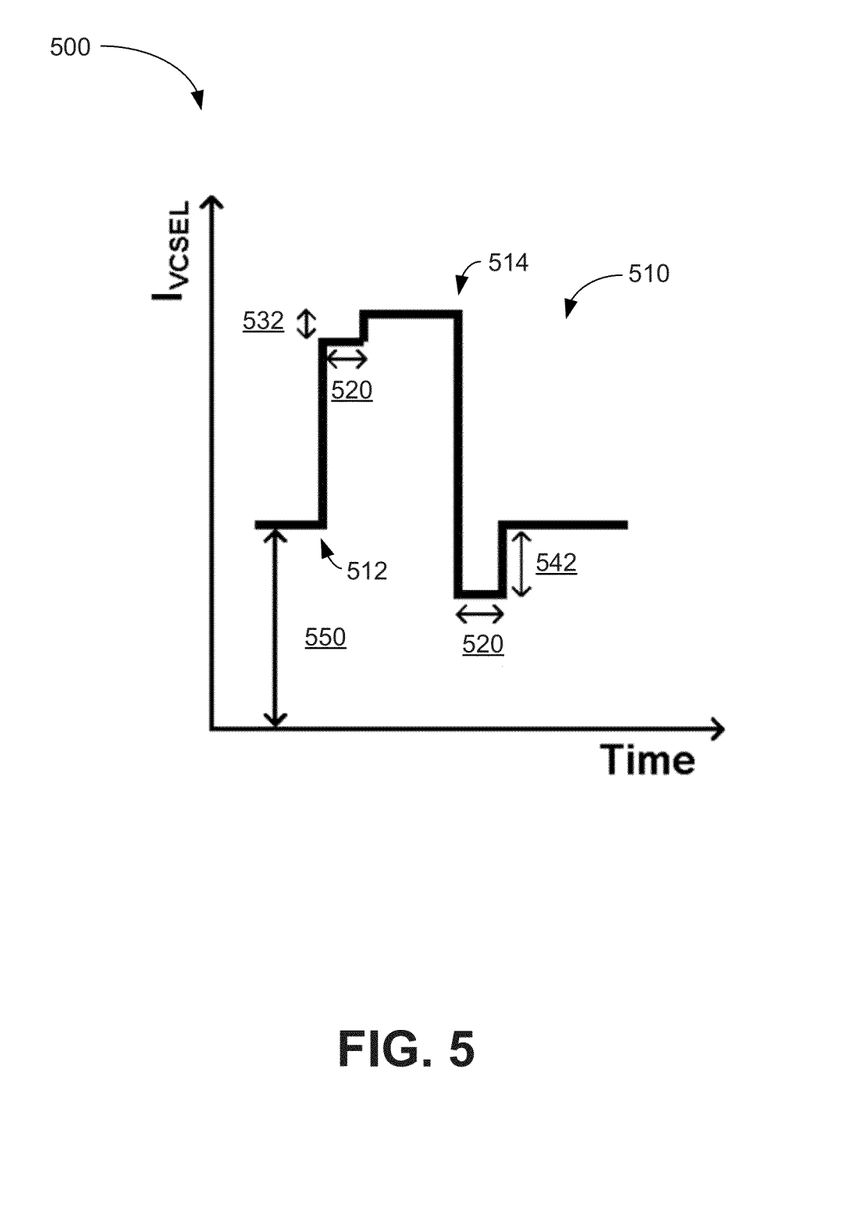
FIG. 5 illustrates an example VCSEL system configured to perform non-linear VCSEL equalization.

FIG. 5 is an example diagram 500 of an input data signal after modulation with non-linear equalization, arranged in accordance with at least some embodiments described herein.

According to the diagram 500, an equalized input data signal 510 may have a baseline current 550 (for example, the bias current 450) and may include a rising edge 512 and a falling edge 514. A VCSEL equalization system such as the VCSEL system 400 may detect the rising edge 512 and the falling edge 514 (using, for example, the rising edge detector 430 and the falling edge detector 440, respectively). The VCSEL equalization system may then equalize the rising edge 512 and the falling edge 514 by application of a rising edge gain 532 and a falling edge gain 542 for an equalization delay time 520. For example, the VCSEL equalization system may increase or reduce the VCSEL current at the rising edge 512 and/or the falling edge 514 based on the rising edge gain 532 and/or the falling edge gain 542. In some embodiments, the VCSEL equalization system may use an equalization delay module similar to the equalization delay module 420 to provide the equalization delay time 520, and may use amplification stages similar to the amplification stages 432 and 442 to supply the rising edge gain 532 and the falling edge gain 542.

Figure 6:
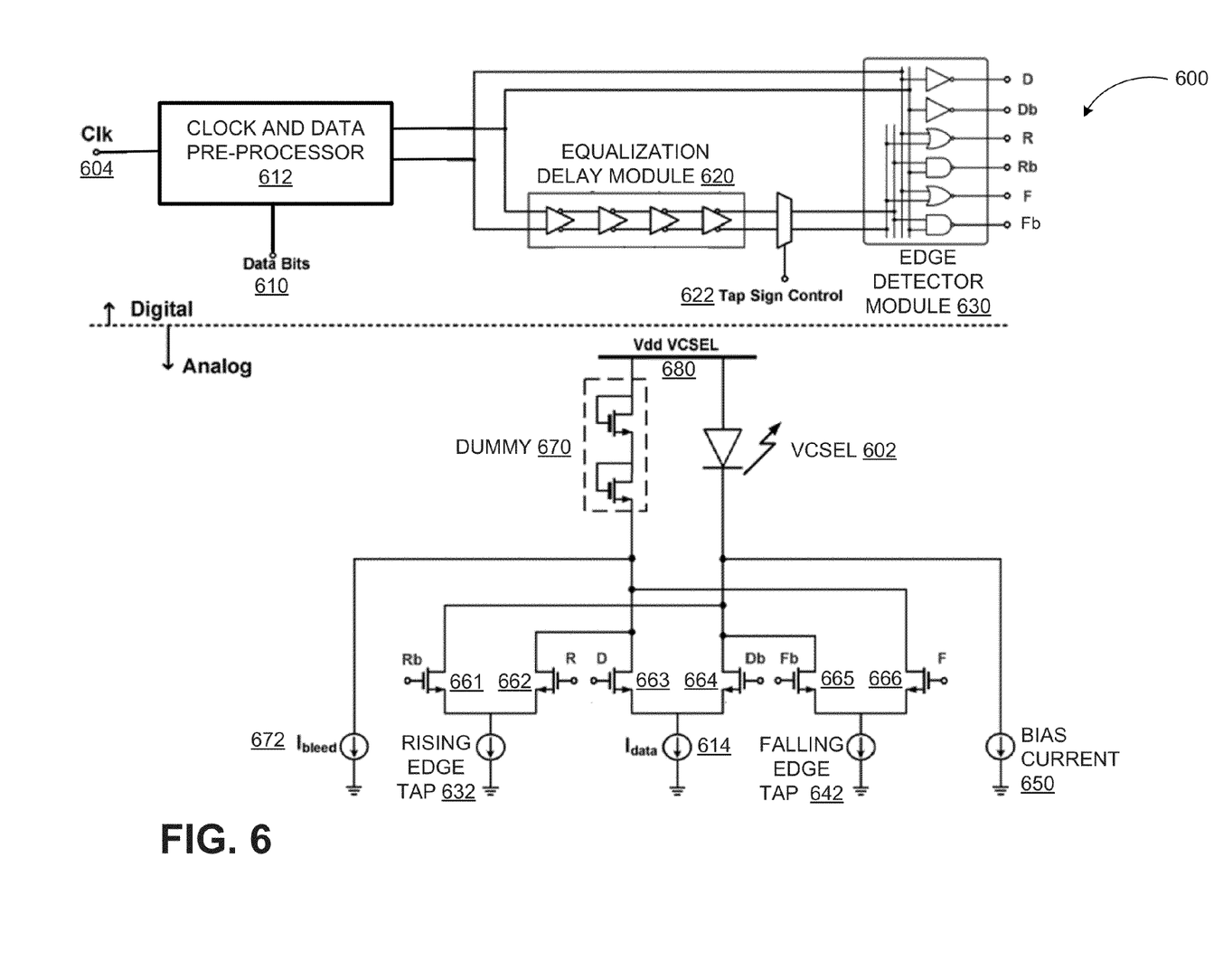
FIG. 6 is a detailed diagram of a VCSEL system configured to perform non-linear VCSEL equalization.

FIG. 6 is a detailed diagram of a VCSEL system 600 configured to perform non-linear VCSEL equalization, arranged in accordance with at least some embodiments described herein.

The VCSEL system 600 may include a digital portion and an analog portion. The digital portion may include a clock input 604 and a data input 610 coupled to terminals of a clock and data pre-processor 612. The pre-processor 612 in turn may be coupled to an equalization delay module 620 and an edge detector module 630. The equalization delay module 620 may be coupled to a tag sign control 622, which in turn may be coupled to the edge detector module 630. The edge detector module 630 may have a number of edge detection output terminals D, Db, R, Rb, F, and Fb.

The edge detection output terminals of the edge detector module 630 may be coupled to corresponding transistors in the analog portion of the VCSEL system 600. For example, the output terminals D and Db may be coupled to the gates of transistors 663 and 664, the output terminals R and Rb may be coupled to the gates of transistors 661 and 662, and the output terminals F and Fb may be coupled to the gates of transistors 665 and 666. The transistors 663 and 664 may also be coupled to a current source $I_{data}$ 614, whereas the transistors 661 and 662 may be coupled to a rising edge tap current source 632 and the transistors 665 and 666 may be coupled to a falling edge tap current source 642. Each of the transistors 661-666 may further be coupled to a VCSEL 602 and a dummy 670.

The VCSEL 620 and the dummy 670 may be coupled to a bias current 650 and a current source $I_{bleed}$ 672, respectively, and also may both be coupled to a VCSEL Vdd voltage terminal 680.

In some embodiments, the pre-processor 612 may be configured to provide an adjusted clock signal and/or a combination of the data input 610 and the clock input 604 to the equalization delay module 620 and/or the edge detector module 630. The equalization delay module 620, which may be similar to the equalization delay module 420, may include a number of inverters or other delay elements coupled in series. The equalization delay module 620 may be configured to provide different equalization delays based on one or more control signals, such as voltage supply adjustments to the delay elements. The tap sign control 622 may be configured to adjust how the output of the equalization delay module 620 is combined with subsequent adjustments made by the rising edge tap current source 632 and the falling edge tap current source 642. The edge detector module 630, which may be similar to the rising edge detector 430 and/or the falling edge detector 440, may include a number of logic gates configured to switch to and/or combine the data signal 610 and/or the output from the equalization delay module 620 when rising and/or falling edges are detected. In some embodiments, the edge detector module 630 may be configured to operate in a differential manner.

The various output terminals of the edge detector module 630 may output signals reflective of the edges of the data signal 610, and may be used to control the transistors 661-666. The transistors 661-666 in turn may add and/or remove currents arising from the rising edge tap current source 632, the current source $I_{data}$ 614, and/or the falling edge tap current source 642 to and from the currents driving the VCSEL 620 and/or the dummy 670 (the bias current 650 and the current source $I_{bleed}$ 672, respectively). The values of the rising edge tap current source 632 and the falling edge tap current source 642 may be based on the rising edge and falling edge tap parameters described above. In some embodiments, the transistors 661-662 and the rising edge tap current source 632 may, along with other suitable components, constitute a rising edge amplification stage such as the amplification stage 432. Similarly, the transistors 665-666 and the falling edge tap current source 642 may, along with other suitable components, constitute a falling edge amplification stage such as the amplification stage 442. The dummy 670 and the current source $I_{bleed}$ 672 may serve as the counterparts to the VCSEL 602 and the bias current 650 in order to provide differential behavior in the analog stage.

Figure 7:
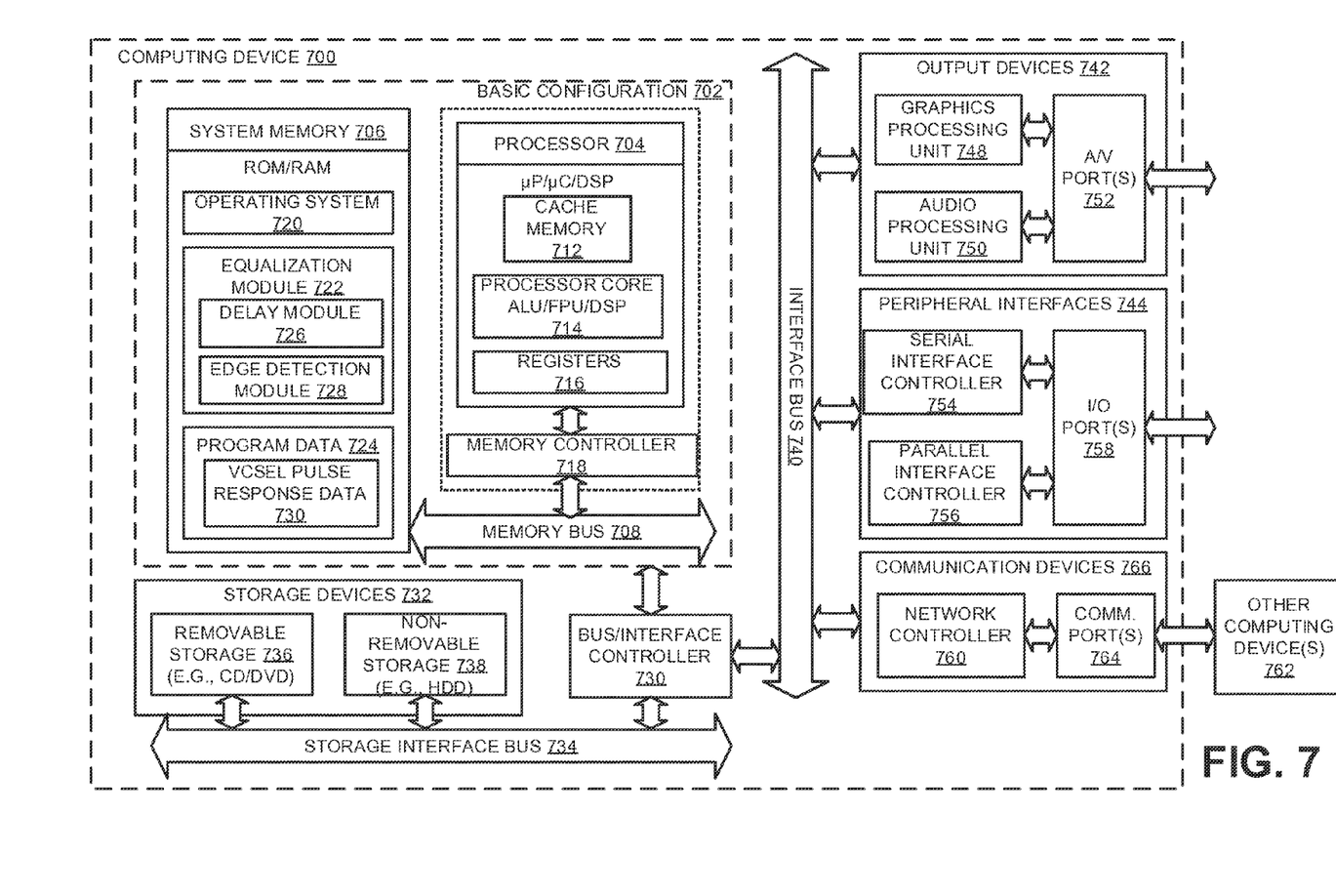
FIG. 7 illustrates a general purpose computing device, which may be used to perform non-linear VCSEL equalization.

FIG. 7 illustrates a general purpose computing device, which may be used to perform non-linear VCSEL equalization, arranged in accordance with at least some embodiments described herein.

For example, the computing device 700 may be used to implement non-linear VCSEL equalization as described herein. In an example basic configuration 702, the computing device 700 may include one or more processors 704 and a system memory 706. A memory bus 708 may be used to communicate between the processor 704 and the system memory 706. The basic configuration 702 is illustrated in FIG. 7 by those components within the inner dashed line.

Depending on the desired configuration, the processor 704 may be of any type, including but not limited to a microprocessor (µP), a microcontroller (µC), a digital signal processor (DSP), or any combination thereof. The processor 704 may include one more levels of caching, such as a level cache memory 712, a processor core 714, and registers 716. The example processor core 714 may include an arithmetic logic unit (ALU), a floating point unit (FPU), a digital signal processing core (DSP Core), or any combination thereof. An example memory controller 718 may also be used with the processor 704, or in some implementations the memory controller 718 may be an internal part of the processor 704.

Depending on the desired configuration, the system memory 706 may be of any type including but not limited to volatile memory (such as RAM), non-volatile memory (such as ROM, flash memory, etc.) or any combination thereof. The system memory 706 may include an operating system 720, an equalization module 722, and program data 724. The equalization module 722 may include a delay module 726 and an edge detection module 728 to implement non-linear VCSEL equalization as described herein. The program data 724 may include, among other data, VCSEL pulse response data 730 or the like, as described herein.

The computing device 700 may have additional features or functionality, and additional interfaces to facilitate communications between the basic configuration 702 and any desired devices and interfaces. For example, a bus/interface controller 730 may be used to facilitate communications between the basic configuration 702 and one or more data storage devices 732 via a storage interface bus 734. The data storage devices 732 may be one or more removable storage devices 736, one or more non-removable storage devices 738, or a combination thereof. Examples of the removable storage and the non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

The system memory 706, the removable storage devices 736 and the non-removable storage devices 738 are examples of computer storage media. Computer storage media includes, but is not limited to, RAM, ROM, EEPROM, flash memory or other memory technology, CD-ROM, digital versatile disks (DVD), solid state drives, or other optical storage, magnetic cassettes, magnetic tape, magnetic disk storage or other magnetic storage devices, or any other medium which may be used to store the desired information and which may be accessed by the computing device 700. Any such computer storage media may be part of the computing device 700.

The computing device 700 may also include an interface bus 740 for facilitating communication from various interface devices (e.g., one or more output devices 742, one or more peripheral interfaces 744, and one or more communication devices 766) to the basic configuration 702 via the bus/interface controller 730. Some of the example output devices 742 include a graphics processing unit 748 and an audio processing unit 750, which may be configured to communicate to various external devices such as a display or speakers via one or more A/V ports 752. One or more example peripheral interfaces 744 may include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. An example communication device 766 includes a network controller 760, which may be arranged to facilitate communications with one or more other computing devices 762 over a network communication link via one or more communication ports 764. The one or more other computing devices 762 may include servers at a datacenter, customer equipment, and comparable devices.

The network communication link may be one example of a communication media. Communication media may be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 700 may be implemented as a part of a general purpose or specialized server, mainframe, or similar computer that includes any of the above functions of features. The computing device 700 may also be implemented as a personal computer including both laptop computer and non-laptop computer configurations.

Figure 8:
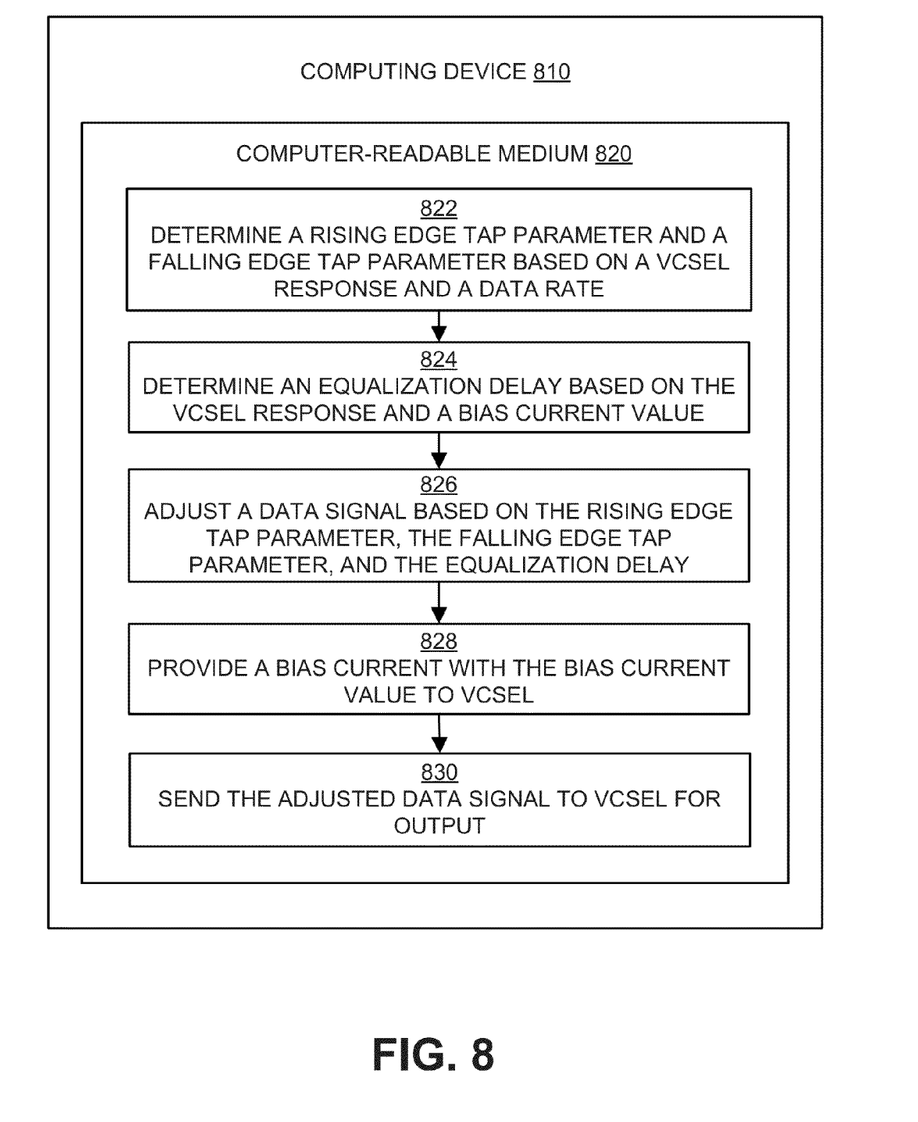
FIG. 8 is a flow diagram illustrating an example method for performing non-linear VCSEL equalization that may be performed by a computing device such as the computing device in FIG. 7.

FIG. 8 is a flow diagram illustrating an example method for performing non-linear VCSEL equalization that may be performed by a computing device such as the computing device in FIG. 7, arranged in accordance with at least some embodiments described herein.

Example methods may include one or more operations, functions or actions as illustrated by one or more of blocks 822, 824, 826, 828, and/or 830, and may in some embodiments be performed by a computing device such as the computing device 800 in FIG. 8. The operations described in the blocks 822-830 may also be stored as computer-executable instructions in a computer-readable medium such as a computer-readable medium 820 of a computing device 810.

An example process for implementing non-linear VCSEL equalization may begin with block 822, "DETERMINE A RISING EDGE TAP PARAMETER AND A FALLING EDGE TAP PARAMETER BASED ON A VCSEL RESPONSE AND A DATA RATE", where a controller or processor block may use a modeled VCSEL response and a data rate of an input data signal to derive a rising edge gain and a falling edge gain, as described above in FIG. 2. For example, the controller/processor block may use the responses of a VCSEL model to an isolated '1' pulse and an isolated '0' pulse to determine rising edge and falling edge gains suitable for reducing distortions from an optical output signal.

Block 822 may be followed by block 824, "DETERMINE AN EQUALIZATION DELAY BASED ON THE VCSEL RESPONSE AND A BIAS CURRENT VALUE", where an equalization delay module may use the modeled VCSEL response and a bias current value for a VCSEL to select an equalization delay suitable for reducing distortions in the optical output signal, as described above. In some embodiments, the equalization delay may be selected as inverse of twice the frequency of a peak in the transfer function associated with the modeled VCSEL.

Block 824 may be followed by block 826, "ADJUST A DATA SIGNAL BASED ON THE RISING EDGE TAP PARAMETER, THE FALLING EDGE TAP PARAMETER, AND THE EQUALIZATION DELAY", where an input data signal may be adjusted based on the rising edge tap parameter, the falling edge tap parameter, and the equalization delay, as described above. In some embodiments, a rising edge detector (for example, the rising edge detector 430) may detect a rising edge in the input data signal and apply a rising edge gain via an amplification stage (for example, the amplification stage 432) to the input data signal. Similarly, a falling edge detector (for example, the falling edge detector 440) may detect a falling edge in the input data signal and apply a falling edge gain via an amplification stage (for example, the amplification stage 442) to the input data signal. In some embodiments, the rising and falling edge gains may be applied for the equalization delay time, as described above.

Block 826 may be followed by block 828, "PROVIDE A BIAS CURRENT WITH THE BIAS CURRENT VALUE TO VCSEL", where the controller/processor block may provide a bias current having a value corresponding to the bias current value used to model the VCSEL response to the VCSEL, as described above.

Block 828 may be followed by block 830, "SEND THE ADJUSTED DATA SIGNAL TO VCSEL FOR OUTPUT", where the controller/processor block may send the adjusted data signal to the VCSEL for output.

Figure 9:
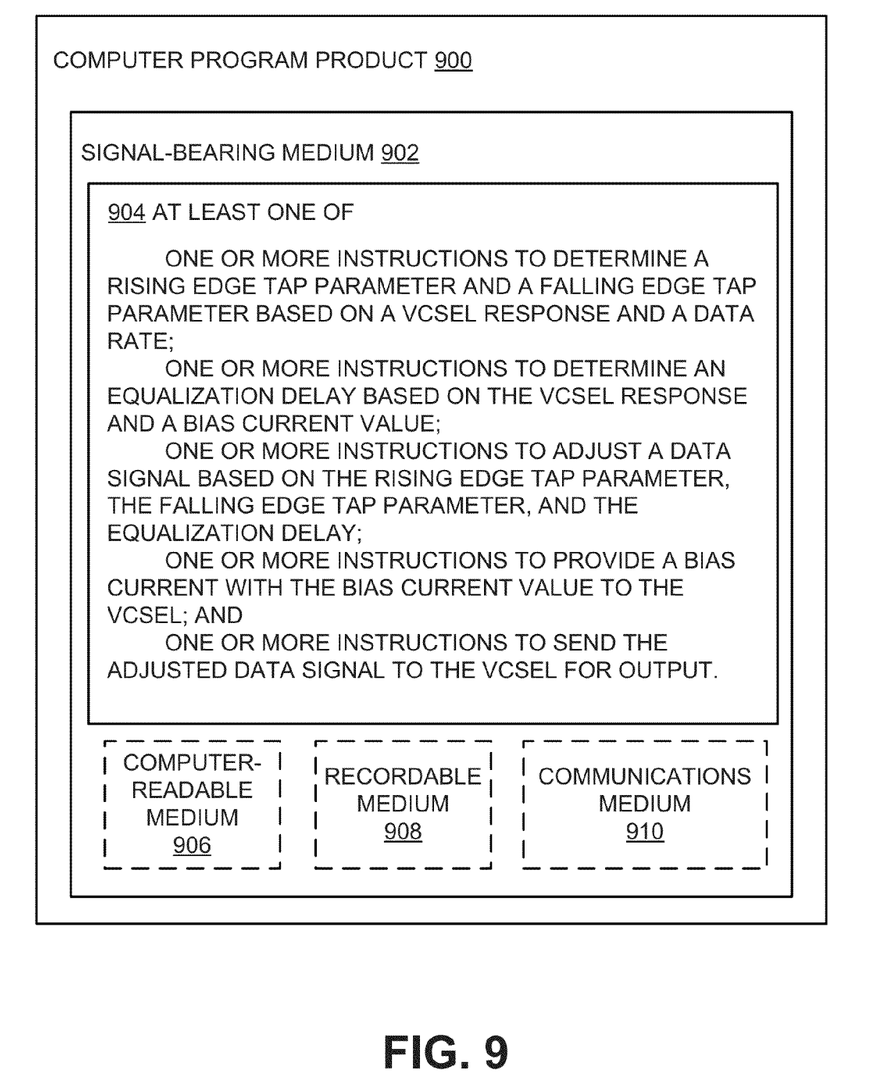
FIG. 9 illustrates a block diagram of an example computer program product, all arranged in accordance with at least some embodiments described herein.

FIG. 9 illustrates a block diagram of an example computer program product, arranged in accordance with at least some embodiments described herein.

In some examples, as shown in FIG. 9, a computer program product 900 may include a signal bearing medium 902 that may also include one or more machine readable instructions 904 that, in response to execution by, for example, a processor may provide the functionality and features described herein. Thus, for example, referring to the processor 704 in FIG. 7, the equalization module 722 may undertake one or more of the tasks shown in FIG. 9 in response to the instructions 904 conveyed to the processor 704 by the medium 902 to perform/control actions associated with non-linear equalization VCSEL equalization as described herein. Some of those instructions may include, for example, instructions to determine a rising edge tap parameter and a falling edge tap parameter based on a VCSEL response and a data rate, determine an equalization delay based on the VCSEL response and a bias current value, adjust a data signal based on the rising edge tap parameter, the falling edge tap parameter, and the equalization delay, provide a bias current with the bias current value to the VCSEL, and/or send the adjusted data signal to the VCSEL for output, according to some embodiments described herein.

In some implementations, the signal bearing media 902 depicted in FIG. 9 may encompass computer-readable media 906, such as, but not limited to, a hard disk drive, a solid state drive, a compact disc (CD), a digital versatile disk (DVD), a digital tape, memory, etc. In some implementations, the signal bearing media 902 may encompass recordable media 907, such as, but not limited to, memory, read/write (R/W) CDs, R/W DVDs, etc. In some implementations, the signal bearing media 902 may encompass communications media 910, such as, but not limited to, a digital and/or an analog communication medium (e.g., a fiber optic cable, a waveguide, a wired communications link, a wireless communication link, etc.). Thus, for example, the program product 900 may be conveyed to one or more modules of the processor 704 by an RF signal bearing medium, where the signal bearing media 902 is conveyed by the wireless communications media 910 (e.g., a wireless communications medium conforming with the IEEE 802.11 standard).

According to some examples, a method is provided to perform a non-linear equalization of a data signal to be output from a vertical-cavity surface-emitting laser (VCSEL). The method may include determining, based on an isolated-pulse-VCSEL-response and a data rate associated with the data signal, a rising edge tap parameter and a falling edge tap parameter and determining an equalization delay based on the isolated-pulse-VCSEL-response and a bias current value. The method may further include adjusting the data signal based on the rising edge tap parameter, the falling edge tap parameter, and the equalization delay, providing a bias current having the bias current value to the VCSEL, and sending the adjusted data signal to the VCSEL for output.

According to some embodiments, the method may further include deriving the isolated-pulse-VCSEL-response from a response of the VCSEL to an isolated '1' pulse and/or an isolated '0' pulse. Deriving the isolated-pulse-VCSEL response may include combining a response of the VCSEL to the isolated '1' pulse and a response of the VCSEL to the isolated '0' pulse. Determining the equalization delay may include determining a VCSEL modulation transfer function using the bias current value and determining the delay based on a frequency of a peak in the VCSEL modulation transfer function. The equalization delay may be equivalent to inverse of twice the frequency of the peak. Adjusting the data signal may include reducing a current supplied to the VCSEL at a rising edge of the data signal based on the rising edge tap parameter for a time duration equivalent to the equalization delay and reducing the current supplied to the VCSEL at a falling edge of the data signal based on the falling edge tap parameter for the time duration.

According to other examples, a vertical-cavity surface-emitting laser (VCSEL) module configured to perform non-linear equalization is provided. The VCSEL module may include a VCSEL, a processor block, and an equalization module. The processor block may be configured to receive a data signal to be output from the VCSEL and determine a rising edge tap parameter and a falling edge tap parameter based on an isolated-pulse-VCSEL-response and a data rate associated with the data signal. The processor block may be further configured to determine an equalization delay based on the isolated-pulse-VCSEL-response and a bias current value and provide a bias current having the bias current value to the VCSEL. The equalization module may be configured to adjust the data signal based on the rising edge tap parameter, the falling edge tap parameter, and the equalization delay, and send the adjusted data signal to the VCSEL for output.

According to some embodiments, the processor block may be further configured to derive the isolated-pulse-VCSEL-response from a response of the VCSEL to at least one of an isolated '1' pulse and an isolated '0' pulse. The processor block may be further configured to combine a response of the VCSEL to the isolated '1' pulse and a response of the VCSEL to the isolated '0' pulse to derive the isolated-pulse-VCSEL response. The processor block may be further configured to determine a VCSEL modulation transfer function using the bias current value and determine the equalization delay based on a frequency of a peak in the VCSEL modulation transfer function. The equalization delay may be equivalent to inverse of twice the frequency of the peak.

According to other embodiments, the VCSEL module may further include an edge detection module configured to detect a rising edge of the data signal and a falling edge of the data signal. The equalization module may be configured to adjust the data signal by reduction of a current supplied to the VCSEL at the rising edge based on the rising edge tap parameter for a time duration equivalent to the equalization delay and reduction of the current supplied to the VCSEL at the falling edge based on the falling edge tap parameter for the time duration. The edge detection module may include a rising edge detection module configured to detect the rising edge of the data signal and a falling edge detection module configured to detect the falling edge of the data signal. The equalization module and/or the edge detection module may be implemented with complementary metal-oxide semiconductor (CMOS) technology. The VCSEL module may further include a dummy VCSEL configured to provide the VCSEL module with fully differential output behavior.

According to further examples, a vertical-cavity surface-emitting laser (VCSEL) circuit configured to perform non-linear equalization is provided. The VCSEL circuit may include an equalization delay module configured to determine an equalization delay based on an isolated-pulse-VCSEL-response and a bias current value. The VCSEL circuit may further include a rising edge detection module configured to output a first adjusted data signal based on an input data signal, the equalization delay, and a rising edge tap parameter, where the rising edge parameter may be based on the isolated-pulse-VCSEL response and a data rate associated with the input data signal. The VCSEL circuit may further include a falling edge detection module configured to output a second adjusted data signal based on the input data signal, the equalization delay, and a falling edge tap parameter, where the falling edge tap parameter may be based on the isolated-pulse-VCSEL-response and the data rate. The VCSEL circuit may further include a VCSEL configured to output a combination of the input data signal, the first adjusted data signal, and the second adjusted data signal.

According to some embodiments, the isolated-pulse-VCSEL-response may be derived from a response of the VCSEL to at least one of an isolated '1' pulse and an isolated '0' pulse. The isolated-pulse-VCSEL-response may be a combination of a response of the VCSEL to the isolated '1' pulse and a response of the VCSEL to the isolated '0' pulse. The equalization delay module may be configured to determine the equalization delay by determination of a VCSEL modulation transfer function using the bias current value and determination of the equalization delay based on a frequency of a peak in the VCSEL modulation transfer function. The equalization delay may be equivalent to inverse of twice the frequency of the peak.

According to other embodiments, the rising edge detection module may be configured to output the first adjusted data signal by detection of a rising edge of the data signal and reduction of a current of the input data signal at the rising edge based on the rising edge tap parameter for a time duration equivalent to the equalization delay. The falling edge detection module may be configured to output the second adjusted data signal by detection of a falling edge of the data signal and reduction of the current supplied to the VCSEL at the falling edge based on the falling edge tap parameter for the time duration. The VCSEL circuit may further include a dummy VCSEL configured to provide the VCSEL circuit with fully differential output behavior for better supply noise rejection. The equalization module, the rising edge detection module, and/or the falling edge detection module may be implemented with complementary metal-oxide semiconductor (CMOS) technology.

In some embodiments, a vertical-cavity surface-emitting laser (VCSEL) module is configured to perform non-linear equalization. The VCSEL module comprises a VCSEL and a processor block configured to receive a data signal to be output from the VCSEL; determine, based on an isolated-pulse-VCSEL-response and a data rate associated with the data signal, a rising edge tap parameter and a falling edge tap parameter; determine an equalization delay based on the isolated-pulse-VCSEL-response and a bias current value; and provide a bias current having the bias current value to the VCSEL; and an equalization module configured to: adjust the data signal based on the rising edge tap parameter, the falling edge tap parameter, and the equalization delay; and send the adjusted data signal to the VCSEL for output. In some examples, a VCSEL may comprise a first mirror (or top mirror), a second mirror (or bottom mirror), and a gain region located between the first and second mirrors. In some examples, the gain region may comprise a quantum well. The first and second mirrors may each comprise a Bragg reflector. The bottom mirror may be essentially totally reflecting at the laser wavelength, and the top mirror may be configured to allow laser radiation to emerge from the gain region through the top mirror. The VCSEL may comprise a substrate supporting the mirrors and gain region therebetween. In some examples, the VCSEL may be configured so that laser emission emerges from the top mirror in a direction substantially normal to the top mirror, which may be termed a vertical direction. An example VCSEL may comprise first and second electrical contacts, such as a n-contact in electrical communication with the top mirror, and a p-contact in electrical communication with the bottom mirror, the electrical contacts being configured to apply an electrical signal across the gain region, for example through the top and bottom mirrors (which may comprise an appropriately doped semiconductor). In some examples, electrical contacts may comprise an electrically conducting material, such as metal or semiconductor. In some examples, an oxide layer or other insulating layer may surround an outer lateral extent of the gain region. In some examples, the top and bottom mirrors may be n-doped and p-doped respectively, and in some examples vice versa. In some examples, methods and apparatus may be configured using vertically-emitting lasers having other configurations, or other vertically emitting diode structures. In some examples, the processor block may receive the data signal from a data source, which may comprise an electrical circuit comprising a data source processor. In some examples, the adjusted data signal is provided to the VCSEL by electrical conductors between electrical outputs of the equalization module and electrical contacts of the laser. Similarly, the bias current may be applied to the electrical contacts of the VCSEL. In some examples, the VCSEL module may be a packaged device with an electrical input configured to receive the data signal, provide a pulsed laser output in response to the data signal, and may include a dedicated power supply or include electrical contacts to power the module. In some examples, a single substrate may be configured to support the VCSEL and also support an electronic circuit, for example an electronic circuit including a processor (and associated components) configured to provide the processor block and the an equalization module.

Various embodiments may be implemented in hardware, software, or combination of both hardware and software (or other computer-readable instructions stored on a non-transitory computer-readable storage medium and executable by one or more processors); the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via application specific integrated circuits (ASICs), field programmable gate arrays (FPGAs), digital signal processors (DSPs), or other integrated formats. However, some aspects of the embodiments disclosed herein, in whole or in part, may be equivalently implemented in integrated circuits, as one or more computer programs executing on one or more computers (e.g., as one or more programs executing on one or more computer systems), as one or more programs executing on one or more processors (e.g., as one or more programs executing on one or more microprocessors), as firmware, or as virtually any combination thereof, and designing the circuitry and/or writing the code for the software and/or firmware are possible in light of this disclosure.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. Also, the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a compact disc (CD), a digital versatile disk (DVD), a digital tape, a computer memory, a solid state drive, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. A data processing system may include one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., control motors to move and/or adjust components and/or quantities).

A data processing system may be implemented utilizing any suitable commercially available components, such as those found in data computing/communication and/or network computing/communication systems. The herein described subject matter sometimes illustrates different components contained within, or connected with, different other components. Such depicted architectures are merely exemplary, and in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). If a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). Virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to perform a non-linear equalization of a data signal to be output from a vertical-cavity surface-emitting laser (VCSEL), the method comprising:
   determining, based on an isolated-pulse-VCSEL-response and a data rate associated with the data signal, a rising edge tap parameter and a falling edge tap parameter;
   determining an equalization delay based on the isolated-pulse-VCSEL-response and a bias current value;
   adjusting the data signal based on the rising edge tap parameter, the falling edge tap parameter, and the equalization delay;
   providing a bias current having the bias current value to the VCSEL; and
   sending the adjusted data signal to the VCSEL for output.

2. The method of claim 1, further comprising deriving the isolated-pulse-VCSEL-response from a response of the VCSEL to at least one of an isolated '1' pulse and an isolated '0' pulse.

3. The method of claim 2, wherein deriving the isolated-pulse-VCSEL response comprises combining a response of the VCSEL to the isolated '1' pulse and a response of the VCSEL to the isolated '0' pulse.

4. The method of claim 1, wherein determining the equalization delay comprises:
   determining a VCSEL modulation transfer function using the bias current value; and
   determining the delay based on a frequency of a peak in the VCSEL modulation transfer function.

5. The method of claim 4, wherein the equalization delay is equivalent to inverse of twice the frequency of the peak.

6. The method of claim 1, wherein adjusting the data signal comprises:
reducing a current supplied to the VCSEL at a rising edge of the data signal based on the rising edge tap parameter for a time duration equivalent to the equalization delay; and
reducing the current supplied to the VCSEL at a falling edge of the data signal based on the falling edge tap parameter for the time duration.

7. A vertical-cavity surface-emitting laser (VCSEL) module configured to perform non-linear equalization, the VCSEL module comprising:
a VCSEL;
a processor block configured to:
receive a data signal to be output from the VCSEL;
determine, based on an isolated-pulse-VCSEL-response and a data rate associated with the data signal, a rising edge tap parameter and a falling edge tap parameter;
determine an equalization delay based on the isolated-pulse-VCSEL-response and a bias current value; and
provide a bias current having the bias current value to the VCSEL; and
an equalization module configured to:
adjust the data signal based on the rising edge tap parameter, the falling edge tap parameter, and the equalization delay; and
send the adjusted data signal to the VCSEL for output.

8. The VCSEL module of claim 7, wherein the processor block is further configured to derive the isolated-pulse-VCSEL-response from a response of the VCSEL to at least one of an isolated '1' pulse and an isolated '0' pulse.

9. The VCSEL module of claim 8, wherein the processor block is further configured to combine a response of the VCSEL to the isolated '1' pulse and a response of the VCSEL to the isolated '0' pulse to derive the isolated-pulse-VCSEL response.

10. The VCSEL module of claim 7, wherein the processor block is further configured to:
determine a VCSEL modulation transfer function using the bias current value; and
determine the equalization delay based on a frequency of a peak in the VCSEL modulation transfer function.

11. The VCSEL module of claim 10, wherein the equalization delay is equivalent to inverse of twice the frequency of the peak.

12. The VCSEL module of claim 7, further comprising an edge detection module configured to:
detect a rising edge of the data signal and a falling edge of the data signal; and wherein the equalization module is configured to adjust the data signal by:
reduction of a current supplied to the VCSEL at the rising edge based on the rising edge tap parameter for a time duration equivalent to the equalization delay; and
reduction of the current supplied to the VCSEL at the falling edge based on the falling edge tap parameter for the time duration.

13. The VCSEL module of claim 12, wherein the edge detection module comprises:
a rising edge detection module configured to detect the rising edge of the data signal; and
a falling edge detection module configured to detect the falling edge of the data signal.

14. The VCSEL module of claim 12, wherein at least one of the equalization module and the edge detection module is implemented with complementary metal-oxide semiconductor (CMOS) technology.

15. The VCSEL module of claim 7, further comprising a dummy VCSEL configured to provide the VCSEL module with fully differential output behavior.

16. A vertical-cavity surface-emitting laser (VCSEL) circuit configured to perform non-linear equalization, the VCSEL circuit comprising:
an equalization delay module configured to determine an equalization delay based on an isolated-pulse-VCSEL-response and a bias current value;
a rising edge detection module configured to output a first adjusted data signal based on an input data signal, the equalization delay, and a rising edge tap parameter, the rising edge tap parameter based on the isolated-pulse-VCSEL-response and a data rate associated with the input data signal;
a falling edge detection module configured to output a second adjusted data signal based on the input data signal, the equalization delay, and a falling edge tap parameter, the falling edge tap parameter based on the isolated-pulse-VCSEL-response and the data rate; and
a VCSEL configured to output a combination of the input data signal, the first adjusted data signal, and the second adjusted data signal.

17. The VCSEL circuit of claim 16, wherein the isolated-pulse-VCSEL-response is derived from a response of the VCSEL to at least one of an isolated '1' pulse and an isolated '0' pulse.

18. The VCSEL circuit of claim 17, wherein the isolated-pulse-VCSEL response is a combination of a response of the VCSEL to the isolated '1' pulse and a response of the VCSEL to the isolated '0' pulse.

19. The VCSEL circuit of claim 16, wherein the equalization delay module is configured to determine the equalization delay by:
determination of a VCSEL modulation transfer function using the bias current value; and
determination of the equalization delay based on a frequency of a peak in the VCSEL modulation transfer function.

20. The VCSEL circuit of claim 19, wherein the equalization delay is equivalent to inverse of twice the frequency of the peak.

21. The VCSEL circuit of claim 16, wherein:
the rising edge detection module is configured to output the first adjusted data signal by:
detection of a rising edge of the input data signal; and
reduction of a current of the input data signal at the rising edge based on the rising edge tap parameter for a time duration equivalent to the equalization delay; and
the falling edge detection module is configured to output the second adjusted data signal by:
detection of a falling edge of the input data signal; and
reduction of the current of the input data signal at the falling edge based on the falling edge tap parameter for the time duration.

22. The VCSEL circuit of claim 16, further comprising a dummy VCSEL configured to provide the VCSEL circuit with fully differential output behavior.

23. The VCSEL circuit of claim 16, wherein at least one of the equalization delay module, the rising edge detection module, and the falling edge detection module are implemented with complementary metal-oxide semiconductor (CMOS) technology.

* * * * *